US010614997B2

(12) United States Patent
Camus

(10) Patent No.: US 10,614,997 B2
(45) Date of Patent: Apr. 7, 2020

(54) SYSTEMS AND METHODS FOR HIGH ENERGY X-RAY DETECTION IN ELECTRON MICROSCOPES

(71) Applicant: EDAX, Incorporated, Mahwah, NJ (US)

(72) Inventor: Patrick Paul Camus, Pen Argyl, PA (US)

(73) Assignee: EDAX, Incorporated, Mahwah, NJ (US)

( * ) Notice: Subject to any disclaimer, the term of this patent is extended or adjusted under 35 U.S.C. 154(b) by 0 days.

(21) Appl. No.: 16/054,673

(22) Filed: Aug. 3, 2018

(65) Prior Publication Data
US 2019/0043689 A1    Feb. 7, 2019

Related U.S. Application Data

(60) Provisional application No. 62/541,226, filed on Aug. 4, 2017.

(51) Int. Cl.
*H01J 37/00* (2006.01)
*H01J 37/244* (2006.01)
*H01J 37/28* (2006.01)

(52) U.S. Cl.
CPC .......... *H01J 37/244* (2013.01); *H01J 37/28* (2013.01); *H01J 2237/2442* (2013.01); *H01J 2237/24475* (2013.01); *H01J 2237/28* (2013.01); *H01J 2237/2802* (2013.01)

(58) Field of Classification Search
CPC ...... H01J 37/244; H01J 37/28; H01J 2237/28; H01J 2237/24475; H01J 2237/2802; H01J 2237/2442

USPC ................. 250/306, 307, 310, 311
See application file for complete search history.

(56) References Cited

U.S. PATENT DOCUMENTS

| | | | |
|---|---|---|---|
| 8,855,809 B2* | 10/2014 | Spencer ................ | B07C 5/3416 378/53 |
| 2001/0032934 A1* | 10/2001 | Lee ....................... | G01T 1/2935 250/370.09 |
| 2004/0208280 A1 | 10/2004 | Yada et al. | |
| 2005/0001213 A1* | 1/2005 | Tindall ................. | H01L 31/0288 257/52 |
| 2010/0096674 A1* | 4/2010 | Christophersen ......... | H01L 31/022408 257/290 |
| 2013/0079918 A1* | 3/2013 | Spencer ................ | B07C 5/3416 700/223 |
| 2014/0284477 A1 | 9/2014 | Ebine et al. | |

(Continued)

FOREIGN PATENT DOCUMENTS

| | | |
|---|---|---|
| DE | 2932174 | 2/1981 |
| JP | H0878718 | 3/1996 |
| WO | WO2017/063157 | 4/2017 |

OTHER PUBLICATIONS

Extended European Search Report for EP 18187376.1; dated Dec. 20, 2018, 8 pages.

*Primary Examiner* — Michael Maskell
(74) *Attorney, Agent, or Firm* — Ray Quinney & Nebeker, P.C.; John O. Carpenter

(57) ABSTRACT

A system for collecting information from a sample, the system includes an X-ray detector configured to mount to an electron microscope, the X-ray detector including a detection tip with a detection material positioned in the detection tip. The detection material includes a compound semiconductor material.

20 Claims, 3 Drawing Sheets

(56) References Cited

U.S. PATENT DOCUMENTS

2016/0216219 A1\* 7/2016 Wright ............ G01N 23/20058
2017/0345616 A1   11/2017 Liriano \* cited by examiner

SYSTEMS AND METHODS FOR HIGH ENERGY X-RAY DETECTION IN ELECTRON MICROSCOPES

CROSS-REFERENCE TO RELATED APPLICATIONS

This application claims the benefit of U.S. Provisional Patent Application No. 62/541,226, filed on Aug. 4, 2017, which are hereby incorporated by reference in their entireties.

BACKGROUND OF THE DISCLOSURE

Data collection systems are used for material analysis and microanalysis of a variety of material properties including chemical, structural, mechanical, crystallographic, or other information. For example, Energy Dispersive Spectrometry ("EDS") has grown into a robust analytic technique for the measurement of material properties. EDS is an analytical technique performed in a scanning electron microscope ("SEM") or transmission electron microscope ("TEM") in a low pressure or near vacuum environment. A sample is positioned beneath a column housing an electron source. The electron source may be any suitable source, such as a tungsten filament, thermal field emission, or LaB6 electron source. The electron source may emit electrons that are directed in a beam through the column and toward a sample chamber. The sample chamber may be connected to the column and allow a sample to be held in line with the electron beam for imaging and/or sampling. The sample may have an unprepared surface allowing sampling of the exposed surface (such as particles or broken and/or cut surfaces) or a prepared surface that is substantially flat. Non-conductive samples may be made more conductive by deposition of a conductive layer over at least part of the surface in order to provide a conductive path to ground. For example, carbon layers or gold layers sputtered onto the surface of a sample can provide a conductive layer that dissipates charge from the sample to the sample stage or other ground within the sample chamber.

Referring now to FIG. 1, conventional EDS may be conducted in an SEM 100 by presenting a sample 102 at in line with an electron beam 104. The surface of the sample 102 may be oriented perpendicularly to the electron beam 104 or may be oriented at an angle not perpendicular to the electron beam 104. For a sample 102 with an uneven surface, tilting of the sample provides line-of-sight to features that are otherwise inaccessible by the electron beam 104. The position of the sample 102 relative to the beam 104 may be achieved by tilted a sample stage 106 or by providing a sample holder (not shown) having non-parallel surfaces mounted to the sample stage 106 or a combination of the two.

Lenses, such as electromagnetic lenses, may focus and/or deflect the electron beam 104 at different working distances (focal length beneath a lowest point of the column 108) and/or locations on the sample 102. A "scan" of the SEM 100 may include construction of an image of a surface of the sample 102 by rastering the beam 104 through a predetermined range of positions and/or deflections of the beam 104. A combination of an EDS detector 110 and rastering of the beam 104 allow for the construction of X-ray count maps of a portion of the sample 102.

The interaction of the electron beam 104 and the sample 102 causes the atoms of the sample 102 to become excited. When an electron or electrons of an atom relaxes to a lower-energy ground state, the atom will emit energy in the form of an X-ray. The X-ray will have a particular energy that correlates to the state of the electron that emitted the X-ray. For example, electrons in the K energy level of the atom will emit an X-ray with a different energy than electrons in the L energy level. The X-rays will also vary in energy depending on the element emitting the X-ray. For example, electrons of the K energy level in aluminum will emit X-rays of different energy than the electrons of the K energy level in iron. Measurement of the X-ray energy allows for differentiation of elements excited by the electron beam 104. The relative quantity of X-ray counts in a given period of time indicates relative concentration of those elements in the sample 102 excited by the electron beam 104.

The EDS detector 110 includes a detection surface that converts X-rays into a voltage signal. The voltage signal is the provided to a pulse processor that measures the signal and passes them to an analyzer, which will then display the data and allow further analysis by a user. The detection surface can be a semiconductor that is cooled to low temperatures, for example, by liquid nitrogen or by Peltier cooling. EDS detectors include silicon-lithium ("Si(Li)") detectors and newer silicon drift detectors ("SDDs").

Rastering the electron beam 104 across the surface of a sample 102 allows for the collection of X-ray count maps of the surface. The X-ray maps can include individually selected energy channels or each data point within the map can include a full spectrum for the point. Calculating the relative concentrations of various elements in the sample 102 is performed by comparing the relative intensities of energy channels having local maximum in the X-ray spectrum of each point.

During X-ray mapping of a sample 102, the individual sampling locations of the surface have relatively low quantities of X-ray counts detected by the EDS detector 110. The relatively low X-ray counts result in low-resolution spectra and/or poor statistical quality of the elemental identification. The EDS detector 110 is limited by the physical collection area of the detection surface in the EDS detector 110 and by the energy resolution that the EDS detector 110 can maintain as throughput increases. Recent advancements in EDS detectors 110 have allowed increased collection rates of X-ray counts and SEM 100 improvements have allowed for greater current to be applied to the sample 102 by the electron beam 104. The increased collection rates of X-ray counts create a greater discrepancy in the statistics when the electron beam 104 falls onto a portion of the sample 102 generating lower count rates. The count rate for a particular sampling location is affected by the sample composition (i.e., atomic weight of the elements present), sample geometry, and beam conditions.

In conventional EDS mapping and other data collection techniques for material analysis, the dwell time per sampling location is set at the beginning of the mapping collection run, and the dwell time is constant for the duration of the mapping. The dwell time is set based on user-selected sampling locations during setup of the mapping; the dwell time is a user-specified estimate of the time needed to attain satisfactory statistics at each sampling location. While data collection rates have increased in recent years, improvements to statistics, particularly early in the scan of a sample 102, are desirable.

SUMMARY

In an embodiment, a system for collecting information from a sample, the system includes an X-ray detector configured to mount to an electron microscope, the X-ray detector including a detection tip with a detection material positioned in the detection tip. The detection material includes a compound semiconductor material.

In some embodiments, the compound semiconductor material is a binary compound semiconductor material. In other embodiments, the detection tip also includes a silicon-based semiconductor material layered with the compound semiconductor material.

This summary is provided to introduce a selection of concepts that are further described below in the detailed description. This summary is not intended to identify key or essential features of the claimed subject matter, nor is it intended to be used as an aid in limiting the scope of the claimed subject matter.

Additional features and advantages of embodiments of the disclosure will be set forth in the description which follows, and in part will be obvious from the description, or may be learned by the practice of such embodiments. The features and advantages of such embodiments may be realized and obtained by means of the instruments and combinations particularly pointed out in the appended claims. These and other features will become more fully apparent from the following description and appended claims, or may be learned by the practice of such embodiments as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which.

DETAILED DESCRIPTION

Figure 1:
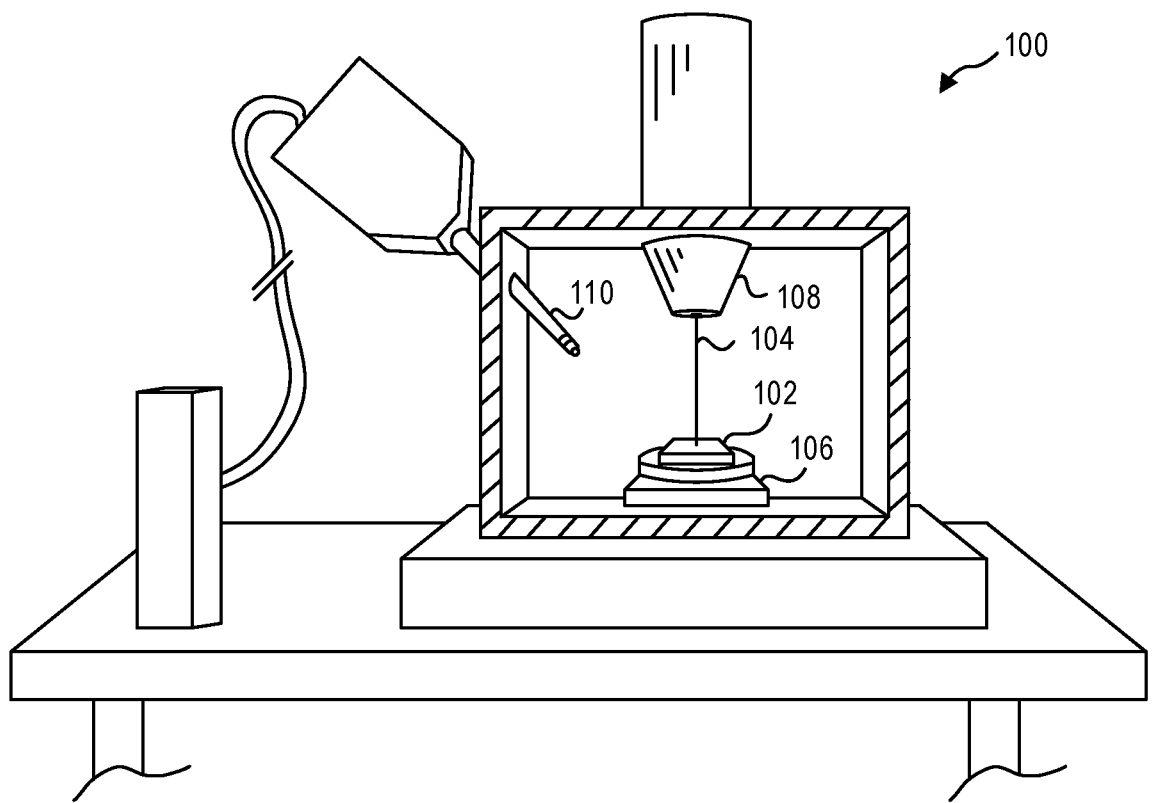
FIG. 1 is a partial cutaway side view of an embodiment of a system for collecting data from a sample, according to the present disclosure.

This disclosure generally relates to data collection devices, systems, and methods for collecting information from a sample. More specifically, the present disclosure relates to improved collection and detection of X-rays emitted from a sample excited by an excitation source. In some embodiments, the excitation source may be an electron source, such as a field emission, $LaB_6$, tungsten, or other filament source. The electron source may emit electrons that are then accelerated toward the sample. The electron beam may be focused, collimated, and directed by a plurality of magnets to position the electron source on the surface of the sample and impart energy onto the surface. While one or more examples may specifically describe a scanning electron microscope, it should be understood that a detector and a detection material according to the present disclosure may be applicable to any electron microscope, such as a high-pressure electron microscope, a transmission electron microscope, a dual-column electron microscope, or other electron microscopes.

The excitation of the sample produces characteristic X-rays that are emitted from the sample. The characteristic X-rays have discrete energy values based upon the energy levels of the electrons in the atoms of the sample. The energy of the emitted X-rays, therefore, may be calculated and may be used to identify the elements present in the sample. By detecting X-rays emitted from the sample over a period of time, the integrated statistics may allow for the calculation of relative atomic composition. For example, the relative emission of X-ray from iron atoms and from oxygen atoms may allow for the identification of iron oxide in the sample. However, the differentiation of $Fe_2O_3$ and $Fe_3O_4$ may require longer integration times than the mere identification of the presence of iron and oxygen. The differentiation of different compositional ratios requires longer integration times to acquire enough emitted X-rays to reduce the statistical error.

Recent improvements in electron microscopes have provided an increase in both the available current and energy of the electron beam. The beam current may be related to the number of X-rays emitted by the sample. For example, an incident electron of the electron beam may impart energy to an atom of the sample, exciting the sample atom and elevating an electron of the sample atom to a higher energy state. When the elevated electron of the sample returns to the stable energy state, the excess energy is emitted as a characteristic X-ray of the atom. By increasing the beam current, the quantity of incident electrons is increased and the sample may emit an associated increase in characteristic X-rays.

The energy of the electron beam may be related to the quantity and/or energy of the characteristic X-rays emitted by the sample. For example, an excited atom of the sample may emit an X-ray that is related to an electron moving between different energy levels within the atom, depending on the excitation energy. For example, lithium only exhibits a single electron energy level, allowing only a single K-line energy to be exhibited by the atom and detected by the detector. However, heavier elements, such as rubidium, may exhibit X-ray emissions from a plurality of energy levels, spanning a wide range of energies. For example, lithium may emit a characteristic X-ray with a 0.055 keV energy, while rubidium may emit characteristic X-rays with energies of 0.097 keV, 1.694 keV, or 13.393 keV. As the lower energy X-rays may be difficult to discern from one another (e.g., the difference between 0.055 keV and 0.097 keV may be within the resolution limits of the detector), reliable detection of the higher energy X-rays from heavier elements may be particularly beneficial to the identification and discrimination of elements present in a sample.

While the present disclosure may describe one or more embodiments of a detector in relation to an electron beam, it should be understood that the present disclosure may be applicable to material analysis, imaging, testing, or combinations thereof including an X-ray source, microwave source, ion source, proton source, gamma source, visible light source, laser source, or any other directed energy source in an electron microscope. In some embodiments, the energy source may be a focused beam energy source, such as one providing a focused electron beam, X-ray beam, ion beam, etc. For example, a focused beam may be a beam that may have an incident diameter at a sample surface of 5 microns or less.

Figure 2:
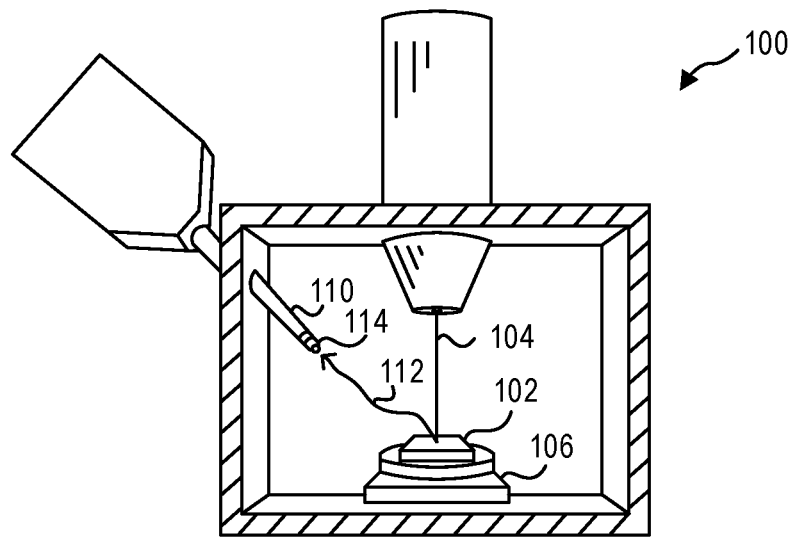
FIG. 2 is a partial cutaway side view of the embodiment of a system for collecting data from a sample of FIG. 1 illustrating the emission of characteristic X-rays, according to the present disclosure.

FIG. 2 illustrates a detector 110 configured to be attached to an electron microscope 100. The detector 110 has a detection tip 114 that is configured to be positioned in a chamber of the electron microscope 100 proximate to a sample 102 that is excited by an electron beam 104.

The detection tip 114 may collect and detect the characteristic X-rays 112 by the interaction of the X-rays 112 with a detection material positioned in the detection tip 114. The X-ray 112 may be absorbed by the detection material and impart energy to the detection material. When an incident X-ray 112 strikes the detection material in the detection tip 114, the energy of the X-ray 112 is absorbed by a series of ionizations within the semiconductor detection material to create a number of electron-hole pairs in the detection material. An electron-hole pair is created for every 3.76 eV of incoming radiation. Thus, for example, a nickel Kα X-ray photon (7,471 eV) will produce a current of 1,966 electrons.

Figure 3:
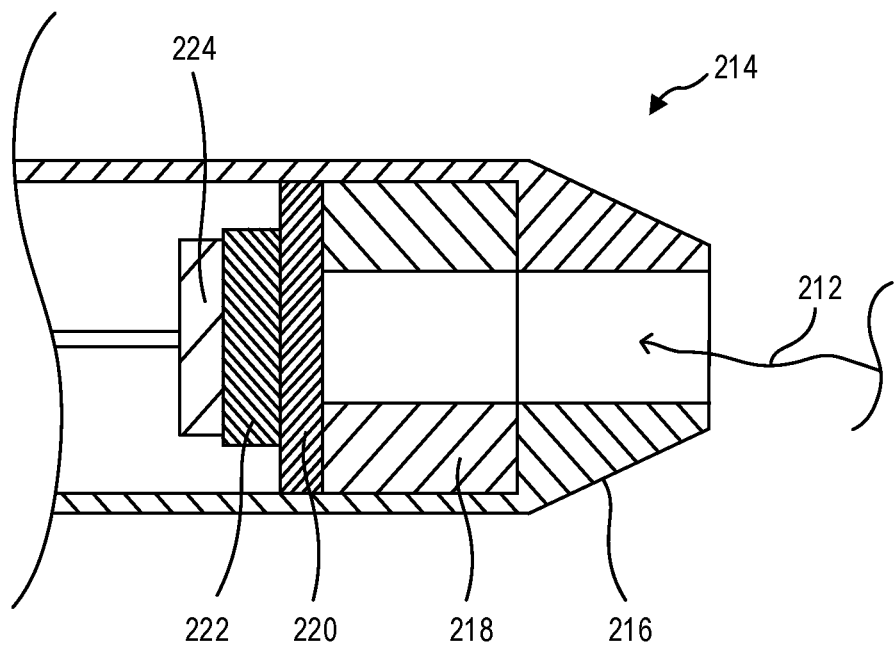
FIG. 3 is a side cross-sectional view of an embodiment of a detection tip, according to the present disclosure.

FIG. 3 is a side cross-sectional view of a detection tip 214 with a detection material 222. In some embodiments, the detection tip 214 may include a collimator 216, an electron trap 218, and/or a window 220 through which the characteristic X-rays 212 from the sample may be received before contacting a detection material 222. In other embodiments, the detection tip 214 may be a windowless detection tip.

The detection tip 214 may include an electron trap 218. The electron trap 218 may provide a magnetic field forward of the detection material 222 to deflect any electrons from the sample, electron beam, or chamber. Errant electrons may introduce error into the signal from the X-rays 212 and may reduce the accuracy of X-ray measurement and/or sample identification.

A bias voltage is applied between electrical contacts on the front face and back of the detection material, and urges the electrons and holes to the opposite electrodes, producing a charge signal, the size of which is proportional to the energy of the incident characteristic X-ray. By measuring the induced current, for example with a field effect transistor (FET) 224 and/or a pulse processor, the energy of the collected X-ray 212 may be identified.

X-rays 212 of differing energies may approach the detection material 222. A higher energy X-ray 212 will penetrate further into the detection material 222 before interacting with the detection material 222. For example, a lower energy X-ray may penetrate into the detection material a first distance from the outer surface of the detection material, and a higher energy X-ray may penetrate into the detection material a second distance from the outer surface of the detection material that is greater than the first distance.

A conventional detection material may allow high energy X-rays to penetrate through the detection material and escape out the inner surface of the detection material without interacting with the detection material. The elemental information of the high-energy X-ray is therefore lost, reducing both the accuracy of the detector and the efficiency of the detector. In particular, the accuracy is reduced as the high-energy X-ray may allow differentiation of elements in the sample and/or more reliable identification of elements in the sample. The efficiency is reduced as the detector fails to detect a portion of incident X-rays from the sample.

A conventional detection material may include a silicon semiconductor material. In some embodiments, the silicon may be doped with one or more dopant materials, such as lithium, to compensate for impurities in the silicon. In other embodiments, the silicon may be a highly pure silicon wafer. For example, a silicon drift detector (SDD) utilizes a silicon wafer of high purity with a plurality of ring electrodes to "drift" charge carriers to a central collection electrode to measure the current.

Figure 4:
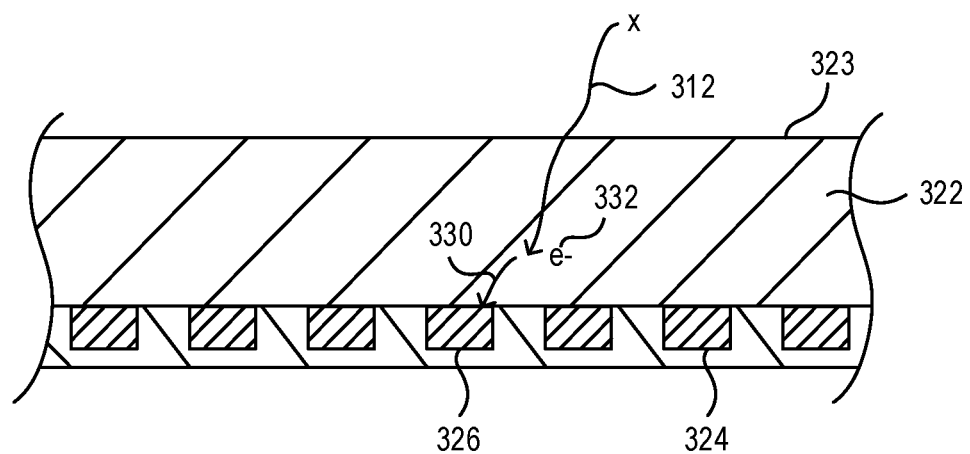
FIG. 4 is a side cross-sectional view of a detection event at an embodiment of a detection material, according to the present disclosure.

FIG. 4 illustrates a detection event in a detection material 322 according to the present disclosure. A detection material 322 according to the present disclosure may include a compound semiconductor material that may have a higher atomic weight and/or density than a silicon semiconductor detection material. In some embodiments, the compound semiconductor material may be a binary compound semiconductor material. For example, the compound semiconductor material may include two elements in substantially equal proportions. The compound semiconductor material may include cadmium. In other examples, the compound semiconductor material may include tellurium. In yet other examples, the compound semiconductor material may include zinc.

In some embodiments, the compound semiconductor material may include both cadmium and tellurium. For example, the compound semiconductor material may be cadmium telluride (CdTe). In other examples, the compound semiconductor material may include additional elements with the cadmium and tellurium. For example, the compound semiconductor material may include cadmium, tellurium, and zinc. In at least one example, the compound semiconductor material may be CZT: a ternary compound of cadmium, tellurium, and zinc.

The compound semiconductor material may have an amorphous microstructure. In other embodiments, the compound semiconductor material may have a crystalline microstructure. For example, the compound semiconductor material may include a microstructure with randomly oriented grains. In another example, the compound semiconductor material may include a microstructure with grains having a preferred orientation. In yet other examples, the compound semiconductor material may be a single crystal crystalline wafer.

The increased atomic weight and/or density of the compound semiconductor material may interact with and detect high energy X-rays 312 in a shorter penetration distance from the outer surface 323 compared to a silicon semiconductor material. In some embodiments, the shorter penetration distance may provide more reliable collection, and an associated increased in accuracy and/or efficiency, when analyzing heavy elements. In other embodiments, the shorter penetration distance may provide more reliable collection, and an associated increased in accuracy and/or efficiency, when operating the excitation source of the electron microscope at acceleration energies above 30 keV, above 40 keV, above 50 keV, above 75 keV, or above 100 keV.

In a detection event, an X-ray 312 may penetrate into the detection material 322 from an outer surface 323. The X-ray 312 may interact with the detection material 322 to transfer energy to the atoms of the detection material by creating electron-hole pairs. The electrons 332 that are mobilized by the interaction of the X-ray 312 may move along a drift path 330 through the detection material 322 based on an electric field from one or more drift rings 324. The electrons 332 may move along the drift path 330 toward a collection anode 326.

Figure 5:
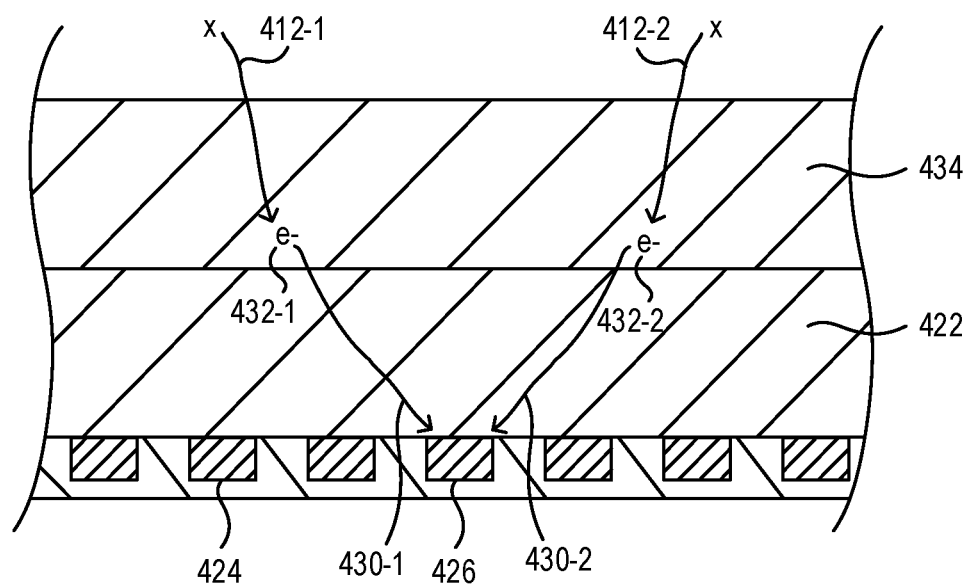
FIG. 5 is a side cross-sectional view of a detection event at another embodiment of a detection material, according to the present disclosure.

FIG. 5 illustrates another example of a detection material according to the present disclosure. The detection material may include a compound semiconductor detection material 422 with a silicon semiconductor (such a lithium-doped silicon) detection material 434 positioned in front of the compound semiconductor detection material 422. In other words, the silicon semiconductor detection material 434 may be positioned closer to the source of incoming X-rays 412-1, 412-2 than the compound semiconductor detection material 422.

In some embodiments, the silicon semiconductor detection material 434 may be contacting the compound semiconductor detection material 422. In other embodiments, the silicon semiconductor detection material 434 may be bonded to the compound semiconductor detection material 422. In yet other embodiments, the silicon semiconductor detection material 434 and compound semiconductor detection material 422 may have a layer of conductive material positioned therebetween. For example, a layer of conductive paste, solder, or other wettable material may be positioned between the silicon semiconductor detection material 434 and the compound semiconductor detection material 422 to provide electrical conductivity. In other examples, a layer of solid conductive material, such as a copper sheet, may be positioned between the silicon semiconductor detection material 434 and the compound semiconductor detection material 422 to provide electrical conductivity.

A high-energy X-ray 412-1 may enter the silicon semiconductor detection material 434 and penetrate through the silicon semiconductor detection material 434 to the compound semiconductor detection material 422. The high-energy X-ray 412-1 may then interact with the compound semiconductor detection material 422 to produce a high-energy plurality of electrons 432-1. The high-energy plurality of electrons may drift along a first electron path 430-1 to a collection anode 426 at the center of the drift rings 424.

A low-energy X-ray 412-2 may also enter the silicon semiconductor detection material 434, and subsequently interact with the silicon semiconductor detection material 434. The low-energy X-ray 412-2 may impart energy to the silicon semiconductor detection material 434 and create a low-energy plurality of electrons 432-2 (lower energy relative to the high-energy plurality of electrons 432-1). The electric field produced by the drift rings 424 may move the low-energy plurality of electrons 432-2 through the silicon semiconductor detection material 434 and into the compound semiconductor detection material 422 along a second drift path 430-2. Upon entering the compound semiconductor detection material 422, the low-energy plurality of electrons 432-2 may continue along the second drift path 430-2 toward the collection anode 426.

In at least some embodiments, an EDS detector for electron microscopes with a compound semiconductor detection material may allow for more reliable detection of high-energy X-rays, and hence higher-energy emission lines from elements, then conventional silicon-based detection materials. The detection of high-energy X-rays may increase detection efficiency and identification accuracy of the characteristic X-rays, improving the quality of the EDS technique and reducing collection times. Reduced collection times also allows for increased mapping times and/or greater throughput on the electron microscope.

One or more specific embodiments of the present disclosure are described herein. These described embodiments are examples of the presently disclosed techniques. Additionally, in an effort to provide a concise description of these embodiments, not all features of an actual embodiment may be described in the specification. It should be appreciated that in the development of any such actual implementation, as in any engineering or design project, numerous embodiment-specific decisions will be made to achieve the developers' specific goals, such as compliance with system-related and business-related constraints, which may vary from one embodiment to another. Moreover, it should be appreciated that such a development effort might be complex and time consuming, but would nevertheless be a routine undertaking of design, fabrication, and manufacture for those of ordinary skill having the benefit of this disclosure.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

The terms "approximately," "about," and "substantially" as used herein represent an amount close to the stated amount that still performs a desired function or achieves a desired result. For example, the terms "approximately," "about," and "substantially" may refer to an amount that is within less than 5% of, within less than 1% of, within less than 0.1% of, and within less than 0.01% of a stated amount. Further, it should be understood that any directions or reference frames in the preceding description are merely relative directions or movements. For example, any references to "up" and "down" or "above" or "below" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

I claim:

1. A system for collecting information from a sample, the system including:
   an X-ray detector configured to mount to an electron microscope, the X-ray detector including a detection tip; and
   a detection material positioned in the detection tip, the detection material including a compound semiconductor including a first element and a second element in equal proportions.

2. The system of claim 1, the detection material including a binary compound semiconductor.

3. The system of claim 1, the compound semiconductor including cadmium.

4. The system of claim 1, the compound semiconductor including tellurium.

5. The system of claim 1, the compound semiconductor including zinc.

6. The system of claim 1, further comprising a silicon semiconductor in the detection tip.

7. The system of claim 6, the compound semiconductor being positioned nearer a body of the X-ray detector relative to the silicon semiconductor.

8. The system of claim 1, the compound semiconductor having an amorphous microstructure.

9. The system of claim 1, the compound semiconductor including at least one doping element in a weight less than 5%.

10. A system for collecting information from a sample, the system including:
    a chamber;
    an electron source configured to direct an electron beam into the chamber;
    an X-ray detector including a detection tip positioned in the chamber; and
    a detection material positioned in the detection tip, the detection material including a compound semiconductor including a first element and a second element in equal proportions.

11. The system of claim 10, the compound semiconductor including cadmium.

12. The system of claim 11, the compound semiconductor including tellurium.

13. The system of claim 12, the compound semiconductor being CdTe.

14. The system of claim 13, the CdTe having an amorphous microstructure.

15. The system of claim 10, the detection material being a first detection material and the X-ray detector further comprising a secondary detection material positioned in the detection tip nearer a center of the chamber than the first detection material.

16. A system for collecting information from a sample, the system including:
    a chamber;
    an electron source configured to direct an electron beam into the chamber;
    an X-ray detector including a detection tip positioned in the chamber; and
    a detection material positioned in the detection tip, the detection material including a doped silicon semiconductor and a compound semiconductor, the compound semiconductor including a first element and a second element in equal proportions and the doped silicon semiconductor being positioned closer to the chamber in the detection tip than the compound semiconductor.

17. The system of claim 16, the compound semiconductor being a binary compound semiconductor.

18. The system of claim 16, wherein the silicon semiconductor and a compound semiconductor contact one another.

19. The system of claim 16, further comprising a conductive layer positioned between the silicon semiconductor and a compound semiconductor.

20. The system of claim 16, further comprising a plurality of drift rings configured to apply an electric field to both the silicon semiconductor and a compound semiconductor.

* * * * *